(12) United States Patent
Sandhu et al.

(10) Patent No.: US 6,573,182 B2
(45) Date of Patent: Jun. 3, 2003

(54) CHEMICAL VAPOR DEPOSITION USING ORGANOMETALLIC PRECURSORS

(75) Inventors: Gurtej S. Sandhu, Boise, ID (US); Pierre Fazan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/961,909

(22) Filed: Sep. 24, 2001

(65) Prior Publication Data

US 2002/0009896 A1 Jan. 24, 2002

Related U.S. Application Data

(62) Division of application No. 08/660,059, filed on May 31, 1996, now Pat. No. 6,313,035.

(51) Int. Cl.[7] .............................................. H01L 21/44
(52) U.S. Cl. ...................... 438/674; 438/648; 438/653; 438/656; 438/680; 438/683; 438/685
(58) Field of Search ................................. 438/674, 680, 438/683, 685, 653, 656, 648

(56) References Cited

U.S. PATENT DOCUMENTS

| | | | |
|---|---|---|---|
| 5,173,327 A | 12/1992 | Sandhu et al. | 427/573 |
| 5,183,684 A | * 2/1993 | Carpenter | 427/574 |
| 5,203,925 A | 4/1993 | Shibuya et al. | 118/724 |
| 5,227,334 A | 7/1993 | Sandhu | 437/190 |
| 5,252,518 A | 10/1993 | Sandhu et al. | 437/200 |
| 5,254,499 A | 10/1993 | Sandhu et al. | 437/192 |
| 5,273,783 A | 12/1993 | Wanner | 427/250 |
| 5,278,100 A | 1/1994 | Doan et al. | 437/200 |
| 5,376,405 A | 12/1994 | Doan et al. | 427/126.1 |
| 5,384,289 A | 1/1995 | Westmoreland | 437/245 |
| 5,425,392 A | 6/1995 | Thakur et al. | 437/173 |
| 5,470,398 A | 11/1995 | Shibuya et al. | 148/33.3 |
| 5,629,229 A | 5/1997 | Si et al. | 438/3 |
| 6,090,709 A | * 7/2000 | Kaloyeros et al. | 438/685 |
| 6,281,123 B1 | * 8/2001 | Sandhu | 438/676 |

FOREIGN PATENT DOCUMENTS

| | | |
|---|---|---|
| EP | 0 689 249 A2 | 6/1995 |
| WO | WO 93/12538 | 6/1993 |
| WO | WO 93/12542 | 6/1993 |

OTHER PUBLICATIONS

Chang and Chou, "Formation and Structure of Epitaxial Ruthenium Silicides on (111)Si," *J. Appl. Phys.*, 68(5):2411–2414, 1990.

Passenheim and McCollum, "Heat Capacity of $RuO_2$ and $IrO_2$ Between 0.54° and 10°K," *The Journal of Chemical Physics*, 51(1):320–321, 1969.

(List continued on next page.)

*Primary Examiner*—David Nelms
*Assistant Examiner*—Renee R Berry
(74) *Attorney, Agent, or Firm*—Fletcher, Yoder & Van Someren

(57) ABSTRACT

A multi-component layer is deposited on a semiconductor substrate in a semiconductor process. The multi-component layer may be a dielectric layer formed from a gaseous titanium organometallic precursor, reactive silane-based gas and a gaseous oxidant. The multi-component layer may be deposited in a cold wall or hot wall chemical vapor deposition (CVD) reactor, and in the presence or absence of plasma. The multi-component layer may also be deposited using other processes, such as radiant energy or rapid thermal CVD.

2 Claims, 2 Drawing Sheets

OTHER PUBLICATIONS

Vining and Allevato, "Progress in Doping of Ruthenium Silicide ($Ru_2Si_3$)," *Proceedings of the 27th Intersociety Energy Conversion Engineering Conference*, Sand Diego, California, Aug. 3–7, 1992.

Kamada et al., "Structure and Properties of Silicon Titanium Oxide Films Prepared by Plasma CVD Method," *Extended Abstracts of the 1991 International Conference on Solid State Devices and Materials, Yokohama*, 207–209, 1991.

Westmoreland et al., "Application for Letters Patent—Method of Reducing Carbon Incorporation Into Films Produced by Chemical Vapor Deposition Involving Titanium Organometallic And Metal–Organic Presursor Compounds," 1–19, Submitted Dec. 22, 1995.

Green et al., "Chemical Vapor Deposition of Ruthenium and Ruthenium Dioxide Films", *J. Electrochem. Soc.*, 132(11):2677–2685, Nov., 1985.

Klee, "Spin–On Processing of Perovskite Thin Films for Innovative Microelectronic Devices," *Proc. of the 4th Int. Conf. on Electronic Ceramics & Applications*, II:1225–1232, 1994.

Klee et al., "Structural and Electrical Characterization of PZT and PLZT Films Grown on Spin–On Processed Conductive Oxide Electrodes," *Integrated Ferroelectrics*, 11:247–258, 1995.

Klee et al., "Deposition of Undoped and Doped Pb (Mg, Nb)$O_3$–PbTi$O_3$, PbZr$_x$Ti$_{1-x}$$O_3$, Alkaline Earth Titanate and Layered Perovskite Thin Films on Pt and Conductive Oxide Electrodes by Spin–On Processing: Correlation of Growth and Electrical Properties," *Science and Technology of Electroceramic Thin Films*, 284:99–115, 1995.

Krusin–Elbaum and Wittmer, "Conducting Transition Metal Oxides: Possibilities for $RuO_2$ in VLSI Metallization," *J. Electrochem. Soc.*, 135(10):2610–2614, Oct. 1988.

Sakiyama et al., "Deposition and Properties of Reactively Sputtered Ruthenium Dioxide Films," *J. Electrochem Soc.*, 140(3):834–839, Mar. 1993.

Vest and Singaram, "Synthesis of Metallo–Organic Compounds for MOD Powers and Films," *Mat. Res. Soc. Symp. Proc.*, 60:35–42, 1986.

Atsuki et al., "Preparation of Bi–Based Ferroelectric Thin Films by Sol–Gel Method," *Jpn. J. Appl. Phys.*, 34:5096–5099, Sep. 1995.

Modak and Dey, "Sol–gel processing and characterization of ferroelectric PZT thin–films," *Materials and Processes for Microelectronic Systems*, pp. 477–488, R.M. Nair et al., eds. (1990).

Melnick et al., "Process optimization and characterization of device worthy sol–gel based PZT for ferroelectric memories," *Ferroelectrics*, 112:329–352 (1990).

Vadimshy and Frankenthal, "Ru and $RuO_2$ as electrical contact materials: preparation and environmental interactions," *J. Electrochem. Soc.*, 126(11):2017–2023 (Nov. 1979).

Kolawa et al., "Reactively sputtered $RuO_2$ diffusion barriers," *Appl. Phys. Lett*, 50(13):854–855 (Mar. 1987).

Kolawa et al., "Microstructure of reactively sputtered oxide diffusion barriers," *J. Electronic Mat.*, 17(5):425–432 (1988).

Krusin–Elbaum et al., "Characterization of reactively sputtered ruthenium dioxide for very large scale integrated metallization," *Appl. Phys. Lett*, 50(26):1879–1881 (Jun. 1987).

Sakiyaam et al., "Properties of reactive sputtered $RuO_2$ films and application to diffusion barrier layer in quarter–micron devices," Jun. 9–10, 1992, VMIC Conference, pp. 317–319.

Pan and Desu, "Reactive ion etching of $RuO_2$ thin films using the gas mixture $O_2$/$CF_3CFH_2$," *J. Vac. Sci. Technol. B*, 12(6):3208–3210 (Nov./Dec. 1994).

Hrbek et al., "The early stages of ruthenium oxidation," *J. Vac. Sci. Technol. A*, 13(3):1409–1412 (May/Jun. 1995).

Petersson et al., "Silicides of ruthenium and osmium: thin film reactions, diffusion, nucleation, and stability," *J. Appl. Phys.*, 53(7):4866–4883 (Jul. 1982).

d'Heurle et al., "Rate of formation of silicon dioxide; semiconducting ruthenium silicide," *Appl. Phys. Lett.*, 47(11):1170–1172 (Dec. 1985).

d'Heurle, F.M., "Formation and oxidation mechanisms in two semiconducting silicides," *Thin Solid Films*, 151:41–50 (1987), Elsevier Sequoia Press, Netherlands.

Ryden et al., "Electrical transport properties of $IrO_2$ and $RuO_2$," *Phys. Rev. B*, 1(4):1494–1500 (Feb. 1970).

Horkans and Shafer, "An Investigation of the Electrochemistry of a Series of Metal Dioxides with Rutile–Type Structure: $MoO_2$, $WO_2$, $ReO_2$, $RuO_2$, $OsO_2$, and $IrO_2$," *J. Electrochem. Soc.: Electrochemical Science and Technology*, 124(8):1202–1207, 1977.

Mattheiss, "Electronic Structure of $RuO_2$, $OsO_2$, and $IrO_2$," *Physical Review B*, 13(6):2433–2450, 1976.

Ryden et al., "High–Field Magnetoresistance of $IrO_2$," *Physical Review B*, 6(6):2089–2092, 1972.

Graebner et al., "Magnetothermal Oscillations in $RuO_2$, $OsO_2$, and $IrO_2$," *Physical Review B*, 13(6):2426–2432, 1976.

Marcus, "Measurement of the Magnetoresistance in the Transition Metal Oxide $RuO_2$," *Physics Letters*, 28A(3):191–192, 1968.

Marcus and Butler, "Measurement of the De Haas–Van Alphen Effect in the Rutile Structure $RuO_2$," *Physics Letters*, 26A(11):518–519, 1968.

\* cited by examiner

CHEMICAL VAPOR DEPOSITION USING ORGANOMETALLIC PRECURSORS

This applicatio is a division of application Ser. No. 08/660,059, filed May 31, 1996, now U.S. Pat. No. 6,313,035.

BACKGROUND OF THE INVENTION

1. Field of the Invention

This invention relates generally to semiconductor processing and, more specifically, to chemical vapor deposition processes for semiconductors. In particular, this invention relates to chemical vapor deposition of dielectric and other materials using organometallic precursors.

2. Description of the Related Art

With reduction in semiconductor device sizes and a corresponding increase in circuit complexity, the need has grown for reliable dielectric materials having high dielectric constants. Traditionally, silicon-based dielectrics, such as silicon dioxide ($SiO_2$) and silicon nitride ($Si_3N_4$), have been used to form insulating layers in semiconductor devices, including dynamic random access memory chips (DRAMs). These silicon-based materials have been popular because they exhibit low current leakage and a high resistance to breakdown. However, these materials may not possess dielectric constants that are sufficiently high to meet the design requirements for more advanced semiconductor devices.

To meet the need for insulating material having a high dielectric constant, various alternatives to silicon-based dielectric materials have been suggested. However, these alternatives have not proved satisfactory due to shortcomings of one kind or another. For example, titanium dioxide ($TiO_2$) has a high dielectric constant but also has a relatively high current leakage compared to $SiO_2$ and $Si_3N_4$. Consequently, $TiO_2$ is typically unsuitable for use in high density semiconductor devices due to the adverse effects of current leakage.

Recently, mixed phase $TiO_2$ and $SiO_2$ has been deposited from titanium tetrachloride ($TiCl_4$), silane ($SiH_4$) and nitrous oxide ($N_2O$) using a plasma chemical vapor deposition (plasma CVD) technique. The object of this technique is to create a dielectric film having a relatively high dielectric constant as compared to $SiO_2$ and a relatively low current leakage as compared to $TiO_2$. However, this method has several drawbacks and fails to provide a satisfactory dielectric insulating layer for high density semiconductor devices. The use of $TiCl_4$ as a titanium source results in the formation of chlorine related impurities in the dielectric film. These impurities are undesirable because chlorine has many adverse qualities, including being an etchant to $SiO_2$, as well as being corrosive. In addition, the use of plasma CVD limits the range of applications for which this dielectric material may be used. Although plasma CVD methods may be employed at lower temperatures than traditional non-plasma methods, they typically produce poor step coverage when used to coat high aspect ratio devices. Therefore, this method does not reliably produce conformal films and thus, is not typically suitable for use in manufacturing modem high aspect ratio devices, such as DRAMs. The use of plasma deposition techniques is also known to create damage centers which induce high leakage in deposited dielectric films. Plasma processes also tend to incorporate hydrogen and other contaminants into the film, thereby further degrading quality and performance of semiconductor devices.

In other recently developed methods, organometallic precursors have been used in metal organic chemical vapor deposition (MOCVD) processes to deposit conductive layers, such as TiN and mixtures of $TiSi_2$. In the conductor deposition processes, a liquid organometallic precursor is typically vaporized and carried into the reactor using a carrier gas. In the reactor the precursor reacts with another gaseous component, such as $SiH_4$, nitrogen fluoride ($NF_3$), or ammonia ($NH_3$), to form conductive films on semiconductor surfaces. However, MOCVD processes have not been used for depositing multi-component oxide materials such as mixed phase titanium silicon oxide dielectrics.

SUMMARY OF THE INVENTION

This invention, in one respect, relates to a method of depositing a multi-component oxide layer on a semiconductor substrate by exposing the semiconductor substrate to gaseous organometaillic precursor and a reactive gas under conditions effective to cause the gaseous organometallic precursor and reactive gas to combine and deposit a multi-component oxide layer on the semiconductor substrate.

In another respect, this invention relates to a method of depositing a layer of titanium silicon oxide on a semiconductor substrate by exposing the semiconductor substrate to gaseous titanium organometallic precursor and reactive silane-based gas under conditions effective to cause the gaseous titanium organometallic precursor and reactive silane-based gas to combine and deposit a layer of titanium silicon oxide on the semiconductor substrate.

In another respect, this invention relates to a method of depositing a layer of titanium silicon oxide on a semiconductor substrate by exposing it to gaseous titanium organometallic precursor, reactive silane-based gas, and gaseous oxidant under conditions effective to deposit a layer of titanium silicon oxide on the semiconductor substrate.

In another respect, this invention relates to a method of depositing a layer of titanium silicon oxide on a semiconductor substrate. The method comprises the steps of positioning the semiconductor substrate within a semiconductor processing chamber, and introducing gaseous reactants including titanium organometallic precursor, reactive silane-based gas and gaseous oxidant into the semiconductor processing chamber under conditions effective to cause the gaseous reactants to deposit a layer of titanium silicon oxide on the semiconductor substrate.

In another respect, this invention relates to a semiconductor device comprising a semiconductor substrate and a titanium silicon oxide dielectric film formed on the substrate. The film may be formed on the semiconductor substrate by exposing the semiconductor substrate to gaseous titanium organometallic precursor, reactive silane-based gas, and gaseous oxidant under conditions effective to cause the gaseous titanium organometallic precursor, reactive silane-based gas and gaseous oxidant to combine and deposit a layer of titanium silicon oxide on the semiconductor substrate.

In another respect, this invention relates to a method of depositing a multi-component layer comprising two or more nitrides on a semiconductor substrate by exposing the semiconductor substrate to gaseous organometallic precursor and reactive gas under conditions effective to cause the gaseous organometallic precursor and reactive gas to combine and deposit a multi-component layer on the semiconductor substrate.

DETAILED DESCRIPTION OF SPECIFIC EMBODIMENTS

Figure 1:
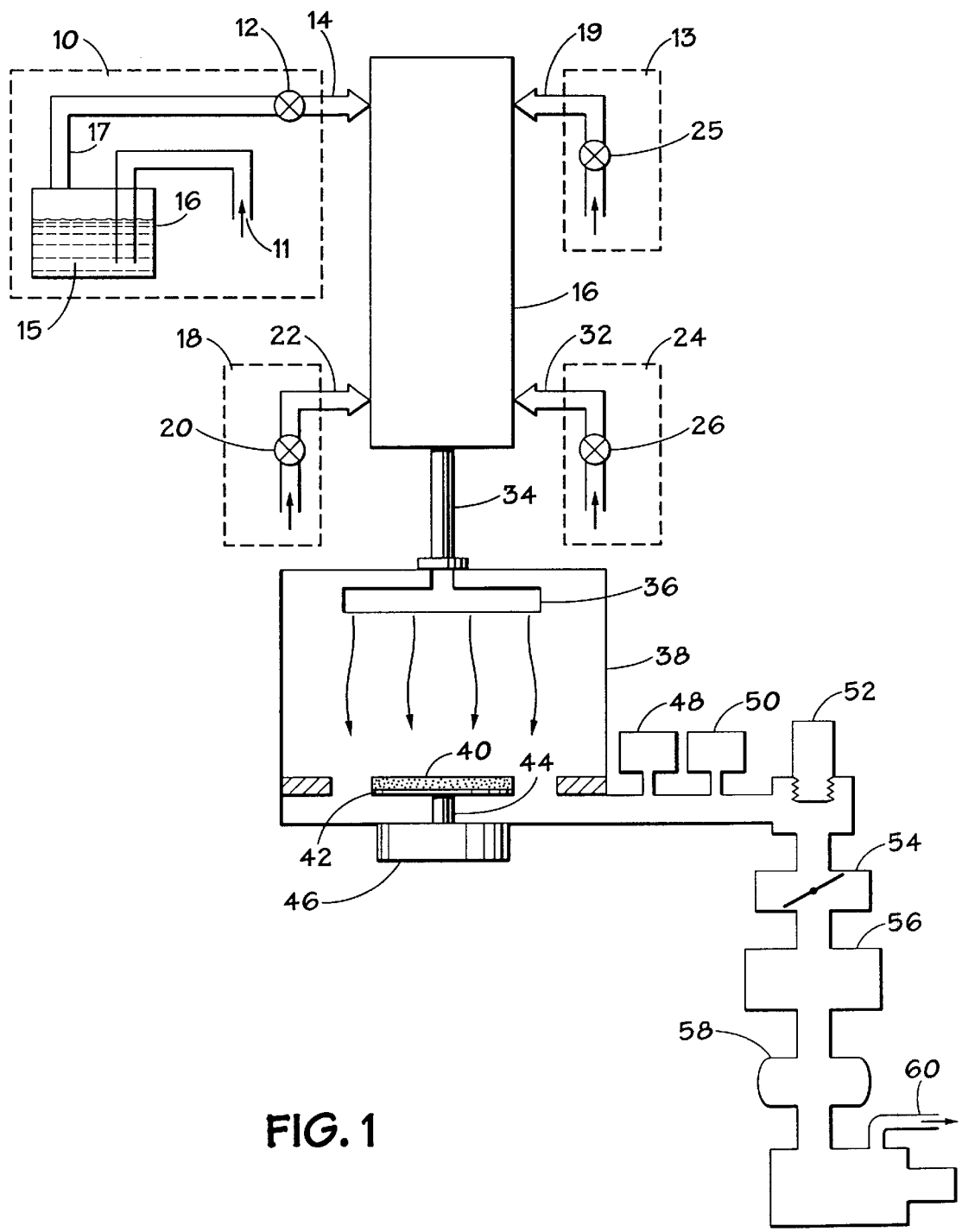
FIG. 1 is a schematic process flow diagram of a cold wall, chemical vapor deposition system which may be used in one embodiment of the process according to the disclosed method.

As used herein, the term "substrate" refers to any semiconductor substrate, such as, for example, a semiconductor wafer substrate of silicon or GaAs. It will be understood by those skilled in the art that the term "substrate" may include either a semiconductor wafer or the wafer along with various process layers formed on the wafer. The term "metals" is defined to include metals, refractory metals, intermetallics or combinations thereof. The term "film" may be used interchangeably with the term "layer".

In embodiments of the disclosed method, highly reactive organic sources of metal may be used to deposit conformal multi-component films, including multi-component oxide films and multi-component nitride films, on semiconductor surfaces. Deposited films may include mixed phase dielectric and conductive films. By "multi-component film" it is mean that a film is comprised of at least one dielectric and/or conductive compound in combination with another material. Examples of such multi-component films include, but are not limited to, films containing a mixture of two or more nitride compounds, such as dielectric mixtures of silicon nitride and aluminum nitride, conductive mixtures of tantalum nitride and titanium nitride, or conductive mixtures of tantalum nitride, titanium nitride and zirconium nitride, or other combinations of these and other nitrides. Films containing at least one nitride mixed with other materials are also possible.

Multi-component films also include multi-component oxide films. By "multi-component oxide film" it is meant that a film is comprised of at least one dielectric or conductive oxide compound in combination with another material. Examples of such multi-component oxide films include, but are not limited to, films containing more than one oxide compound or films containing a mixture of oxide and nitride compounds. These films may be deposited using more than one organometallic precursor, or by using an organometallic precursor and other reactive gases, such as a reactive silane-based gas and/or a gaseous oxidant. In the practice of this disclosed method, it is typical that deposition of these films occur at low temperatures and in the absence of plasma to activate deposition. However, those skilled in the art will recognize that benefits of the disclosed method may also be obtained at higher process temperatures and by using plasma.

In one embodiment of the disclosed method a titanium silicon oxide dielectric film is deposited by exposing a semiconductor device to quantities of gaseous reactants, including gaseous titanium organometallic precursor, reactive silane-based gas, and gaseous oxidant. A carrier gas is optional, but advantageously used to transport the organometallic precursor and to control deposition characteristics. The disclosed method offers advantages over methods previously employed to deposit titanium silicon oxide dielectric layers by eliminating the need for plasma and titanium tetrachloride precursor, therefore providing a substantially more production worthy process. Advantages of the disclosed method may include providing deposited titanium silicon oxide layers with essentially no high leakage damage centers and substantially no chlorine and/or hydrogen related impurities. Other advantages may include providing good step coverage of high aspect ratio devices at relatively low temperatures.

Although titanium silicon oxide is deposited in one embodiment, other multi-component oxide films may be deposited using different gaseous reactants. These other films include, but are not limited to, dielectric films such as tantalum silicon oxide, mixtures of titanium oxide and silicon nitride, mixtures of aluminum oxide and silicon oxide, mixtures of aluminum oxide, silicon oxide and titanium oxide and other combinations of these and other compounds. Also included are conductive films including a ruthenium oxide component, such as mixtures of titanium nitride and ruthenium oxide. During deposition, energy is supplied to a semiconductor substrate to cause a reactive deposition to take place, resulting in deposition of mixed phase metal silicon oxide onto the substrate surface. The process may be carried out in any semiconductor processing chamber or other environment known to the art that is suitable for depositing thin films on semiconductor substrates from organometallic precursors. For example, commercially available deposition equipment from suppliers such as Applied Materials, Novellus and/or Genus may be utilized. Particular models of such equipment include Applied Materials 5000D, Novellus Concept I and Genus 8700.

In the practice of the disclosed method, a variety of organometallic precursors may be utilized. Organometallic compounds contain a central or linking atom or ion (such as Ti) combined by coordinate bonds with a definite number of surrounding ligands, groups or molecules, with at least one of which is organic. As used herein, the term "organometallic" includes organometallic compounds having a central atom bonded to at least one carbon atom of a ligand, as well as "metal-organic" compounds having a central atom bonded directly to atoms other than carbon in a ligand. Precursor compositions, as well as methods and apparatus that use such precursors, may be found in U.S. Pat. Nos. 5,384,289, 5,273,783, 5,227,334, 5,278,100, 5,252,518 and 5,254,499, the disclosures of which are expressly incorporated by reference herein.

In one embodiment of the disclosed method, titanium organometallic precursors of the formula $Ti(NR_2)_4$ may be used, where R is selected from the group consisting of H and a carbon containing radical, such as an alkyl. Specific examples of suitable titanium precursors include tetrakis-dimethyl aminotitanium $[Ti(N(CH_3)_2)_4]$ (TDMAT) and tetrakisdiethylamino titanium $[Ti(N(C_2H_5)_2)_4]$ (TDEAT). Other suitable titanium precursors include bis (2,4-dimethyl-1,3-pentadienyl) titanium (BDPT), cyclopentadienylcycloheptatrienyltitanium (CpTiCht) and biscyclopentadienyltitanium diazide $(Cp_2Ti(N_3)_2)$. TDMAT is the typically used titanium precursor. Organometallic precursors, such as TDMAT, are typically liquid and may be vaporized for the CVD reaction. In other cases the organometallic precursor may be a solid which is sublimed to a vapor for reaction in the CVD chamber, such as bis[ethene 1,2(N,N'-dimethyl) diamide] titanium (IV), dicyclooctatetraenetitanium, and tri(cyclooctatetraene) dititanium. In the practice of the disclosed method, a carrier gas, reactive gas or mixtures thereof may optionally be utilized to assist in vaporization and/or transportation of an organometallic precursor.

Because titanium organometallic precursors are used as a Ti source rather than titanium tetrachloride, the disclosed method offers the advantage of depositing titanium silicon oxide layers that are substantially free of chlorine related impurities when non-chlorine containing silane reactive gases are used.

Organometallic precursors having oxygen atoms may also be successfully employed without the need for a gaseous oxidant. However, a gaseous oxidant may be employed with these precursors, if desired. Examples of such titanium organometallic precursors containing oxygen atoms include, but are not limited to, titanium ethoxide and titanium tetra-i-propoxide [Ti(O-i-$C_3H_7$)$_4$]. Furthermore, although a titanium organometallic precursor is used in this embodiment, other organometallic precursors may be successfully employed to form other types of films. Examples of non-titanium organometallic precursors include aluminum precursors, such as tri-isobutyl aluminum (TIBA), which may be used to deposit aluminum-containing films. Tantalum organometallic precursors, such as pentakisdimethyl aminotantalum [Ta(N($CH_3$)$_2$)$_5$] and pentaethoxy tantalum [Ta(O$C_2H_5$)$_5$], may be used to deposit films containing tantalum. For example, pentaethoxy tantalum may be used in the formation of tantalum silicon oxide films, and may also be used without the presence of a gaseous oxidant if desired.

Suitable reactive silane-based gases include silane ($SiH_4$), disilane ($Si_2H_6$) and other silane-based gases, such as halosilanes and organosilanes. Acceptable organosilanes include trimethylsilane and triethylsilane. Acceptable halosilanes include monohalogentated or polyhaogenated silanes, such as fluorosilanes, bromosilanes, iodosilanes, and chlorosilanes. Specific chlorosilanes include chlorosilane, dichlorosilane, trichlorosilane and silicon tetrachloride. Suitable reactive silane-based gases may also include those having oxygen atoms, such as tetraoxysilane (TEOS), and these may be successfully employed in the absence or presence of a gaseous oxidant. Examples of reactive silane-based gases that may be used to form multi-component oxide/nitride films include those containing nitrogen atoms, such as tris(dimethyl amino) silane, which may be employed with a titanium organometallic precursor to form a titanium oxide/silicon nitride dielectric film. In the present embodiment, silane ($SiH_4$) is the typically used reactive silane-based gas.

In the present embodiment, the typical gaseous oxidant is $O_2$. However, any other gaseous oxidant containing oxygen would be suitable, for example, ozone ($O_3$), nitrous oxide ($N_2O$), nitrous dioxide ($NO_2$), or high temperature mixtures of oxygen and water vapor or oxygen and hydrogen. The carrier gas may be selected from any noble or nonreactive inert gas, such as helium, argon or nitrogen, or alternatively may be a reactant gas, such as a gaseous oxidant, hydrogen or other reactive gas. Typically the carrier gas is argon.

In the practice of the disclosed method, desired Ti/Si ratios and dielectric constants may be imparted into deposited films by controlling quantities of different gases used in the process. For example, by adjusting flow rates of titanium organometallic precursor and reactive silane-based gas, the dielectric constant and current leakage of a titanium silicon oxide film may be controlled to fall anywhere within a range between that of pure $SiO_2$ (dielectric constant of about 4), and pure $TiO_2$ (dielectric constant of about 80–100).

In the embodiment, the reaction to deposit titanium silicon oxide from TDMAT, silicone and oxygen proceeds as follows:

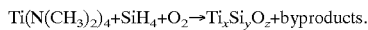

where x is from about 0 to about 1, y is from about 0 to about 1, and z is from about 0.5 to about 2. In this embodiment, byproducts that are formed are substantially removed by the carrier in any unreacted gases and do not form a part of the deposited film.

Using the disclosed method, deposition of titanium silicon oxide is typically carried out in the absence of plasma in a cold wall CVD reactor. However, the method may also be practiced in other types of environments or semiconductor processing chambers, including, for example, in a non-plasma hot wall CVD process, a plasma cold wall or hot wall CVD process, or in a radiant energy or rapid thermal CVD process. When carried out in the absence of plasma, the method offers the advantages of substantially eliminating the creation of high leakage damage centers in deposited dielectric layers and of incorporating substantially no hydrogen into these deposited layers.

Within the CVD reactor, titanium organometallic precursor is mixed with reactive silane-based gas and gaseous oxidant to deposit a mixed phase titanium silicon oxide film on a semiconductor substrate. A carrier gas is typically used to transport the titanium organometallic precursor into the reactor and to regulate the gas distribution above the substrate surface so that the uniformity of the titanium silicon oxide film deposition is controlled. The separate gases are typically introduced to the CVD reactor through separate inlets. However, those skilled in the art will recognize that one or more of the gases may be introduced as a mixture into the reactor.

When using the method to form a film of titanium silicon oxide for use in a high density semiconductor device, such as a DRAM, it is advantageous to produce a film having a Ti/Si ratio that is as high as possible, without sacrificing reliability due to current leakage. It is also preferable to deposit a film having a good step coverage. For a high density DRAM, typical values of dielectric constant and current leakage are from about 10 and about 10 nA/$cm^2$ to about 300 and about 100 nA/$cm^2$, advantageously about 20 and about 50 nA/$cm^2$, respectively. Step coverage is typically about 100% for structures having aspect ratios of about 5:1. To achieve these parameters, the volumetric ratio of titanium organometallic precursor to reactive silane-based gas to gaseous oxidant is from about 1:300:600 to about 1:5:10, and advantageously about 1:80:160. These ranges provide a respective Ti/Si ratio of from about 0.1 to about 1.9, and advantageously, about 1. The corresponding dielectric constants of films deposited using these flow rate ranges are from about 10 to about 30, and advantageously, about 20.

In one embodiment, carrier gas is used to control the gas distribution and uniformity of the film deposited across the substrate surface, as well as to transport the titanium organometallic precursor into the reactor. The total flow rate of carrier gas is typically from about 50 standard cubic centimeters per minute (sccm) to about 2000 sccm, usually about 500 sccm. When carrier gas is used to vaporize and transport the organometallic precursor into the reactor, such as in a bubbler apparatus, the rate of carrier gas used to transport the organometallic precursor may be any rate suitable to achieve vaporization and transportation of the precursor, but is typically from about 20 sccm to about 400 sccm. When carrier gas is used to vaporize and transport the organometallic precursor, the balance of the total desired carrier gas flow rate is introduced separately into the reactor. The CVD reactor is typically operated under low pressure chemical vapor deposition (LPCVD) conditions, with the reactor pressure being typically from about 150 mTorr to about 100 Torr, advantageously about 1 Torr. The typical substrate temperature is from about 100° C. to about 600° C., most typically about 400° C.

As an example, in a 6 liter CVD reactor the flow rate of titanium organometallic precursor is typically from about 2 sccm to about 50 sccm, the flow rate of reactive silane-based gas is from about 50 sccm to about 2000 sccm, the flow rate of gaseous oxidant is from about 200 sccm to about 4000 sccm, and the total flow rate of carrier gas from about 50 sccm to about 2000 sccm. Advantageously, the flow rate of titanium organometallic precursor is about 5 sccm, with a reactive silane-based gas flow rate of about 400 sccm, a gaseous oxidant flow rate of about 800 sccm, and a total carrier gas flow rate of about 500 sccm. The temperature is about 400° C. and the pressure is about 1 Torr. Using these reaction parameters will result in a titanium silicon oxide film that is uniformly deposited on a high aspect semiconductor substrate surface at a rate of from about 50 Å to about 100 Å per minute and that has a dielectric constant of from about 10 to about 30. In this embodiment, a film thickness of from about 15 Å to about 500 Å is typical, with a thickness of about 15 Å being advantageous.

FIG. 1 is a schematic process flow diagram of one possible embodiment of the disclosed method for depositing a titanium silicon oxide film on a semiconductor substrate. In FIG. 1, a source 10 of titanium organometallic precursor, mixed with a suitable carrier gas 11 and including gas flow control valve 12 is connected through input line 14 to gas premixing chamber 16. Carrier gas is bubbled through titanium organometallic precursor 15 within bubbler apparatus 16. Carrier gas, at least partially saturated with titanium organometallic precursor compound 15 is transported via line 17. Similarly, a source 18 of reactive silane-based gas is connected through gas flow control valve 20 and input line 22 to premixing chamber 16. A source of gaseous oxidant 13 is connected through a gas flow control valve 25 and input line 19 to premixing chamber 16. A gas source 24 of a suitable carrier gas is connected through gas flow control valve 26 and main carrier gas flow line 32 to premixing chamber 16.

The above gases introduced into premixing chamber 16 are thoroughly mixed within premixing chamber 16 and then passed by way of output line 34 through an associated shower head 36 into main CVD reaction chamber 38. In chamber 38, individual silicon wafers 40 are mounted as shown on a graphite boat 42 which is supported by post member 44 on a lower wall of CVD chamber 38. Graphite boat 42 is heated using convection heating by halogen lamp 46 which is controlled to elevate the temperature within LPCVD chamber 38 to a desired temperature.

As gases from sources 18, 10, 13, and 24 intermix inside CVD reaction chamber 38, they begin to react to thereby deposit a uniform film of titanium silicon oxide upon heated surfaces of silicon wafers 40. Deposition pressure within CVD reaction chamber 38 is monitored and maintained by use of conventional pressure control components consisting of pressure sensor 48, pressure switch 50, air operating vacuum valve 52 and pressure control valve 54. Reaction by-product gases given off by the chemical reaction taking place in CVD reaction chamber 38 pass through particulate filter 56 and then through blower 58 before exhausting through output vent line 60.

Figure 2:
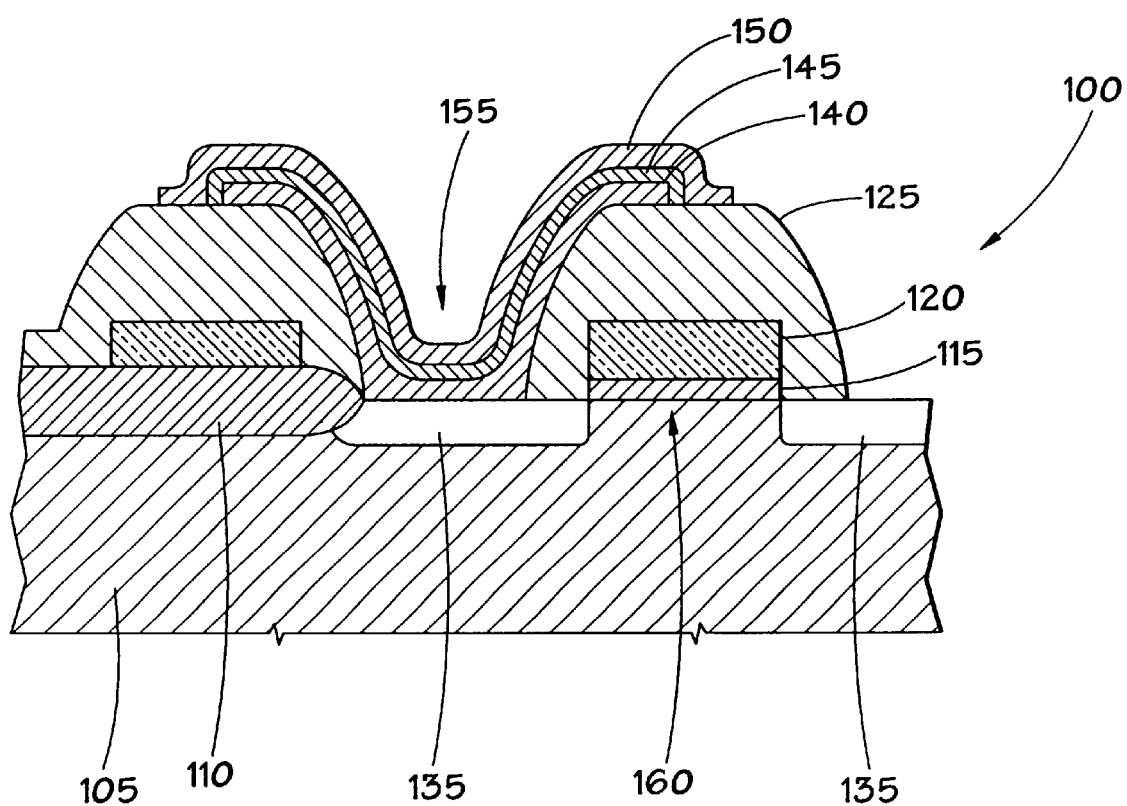
FIG. 2 is a cross-sectional representation of a layer of titanium silicon oxide being deposited on a semiconductor substrate to form a DRAM capacitor layer.

In FIG. 2, a semiconductor device 100 processed in accordance with the disclosed method is shown. As shown in FIG. 1, the semiconductor device 100 is a memory cell, in particular a DRAM cell, which may be replicated thousands of times to form a memory array (not shown). The device 100 includes a silicon substrate 105 (for example a p-type substrate) having field oxide regions 110. Transistors 160 may be formed in the active regions of the substrate 105 through the use of a gate oxide 115 and a gate 120. The gate 120 may be formed from polysilicon, a metal silicide, or a combination thereof. N-type active areas 135 are formed on either side of the transistor gate 120. An oxide 125 forms a protective insulator over the gate 120 and may also be utilized as a lightly doped drain (LDD) spacer oxide during the formation of the active areas 135. For the example shown, the gate 120 may be utilized as a DRAM wordline. A DRAM storage node or memory cell 155 may be formed utilizing a titanium silicon oxide layer disclosed herein for at least part of the capacitor dielectric 145. In particular, a bottom storage node conductor plate 140 (for example polysilicon) is formed and a conformal capacitor dielectric layer 145 is formed over the bottom plate 140. A top capacitor plate 150 (for example polysilicon) is then formed over the dielectric layer 145. The dielectric layer 145 may be formed entirely by a titanium silicon oxide layer, or alternatively, a combination of layers may be used including a titanium silicon oxide layer and other dielectric layers, such as silicon oxide or silicon oxide-silicon nitride. As will be appreciated by those skilled in the art, although the methods and apparatus have been described herein in relation to a memory cell and a capacitor oxide, other semiconductor s devices and/or structures for any number of uses may be possible, including for transistor gate oxides, other insulator layers or barrier layers.

While the compositions and methods of this invention have been described in terms of certain disclosed embodiments, it will be apparent to those of skill in the art that variations may be applied to the compositions and methods described herein without departing from the concept, spirit, and scope of the invention as defined by the appended claims.

What is claimed is:

1. A method of depositing a multi-component layer comprising two or more nitrides on a semiconductor substrate, comprising the step of:

exposing the semiconductor substrate to gaseous organometallic precursor and reactive gas under conditions effective to cause the gaseous organometallic precursor and reactive gas to combine and deposit a multi-component layer comprised of two or more nitrides on the semiconductor substrate.

2. The method of claim 1, wherein the multi-component layer comprises at least one of a mixture of silicon nitride and aluminum nitride, a mixture of tantalum nitride and titanium nitride, or a mixture of tantalum nitride, titanium nitride and zirconium nitride.

* * * * *